US008008638B2

(12) United States Patent
Aoki

(10) Patent No.: US 8,008,638 B2
(45) Date of Patent: Aug. 30, 2011

(54) ION IMPLANTATION APPARATUS AND ION IMPLANTATION METHOD

(75) Inventor: Yoshiro Aoki, Tokyo (JP)

(73) Assignee: Sumco Corporation, Tokyo (JP)

( * ) Notice: Subject to any disclaimer, the term of this patent is extended or adjusted under 35 U.S.C. 154(b) by 236 days.

(21) Appl. No.: 12/496,836

(22) Filed: Jul. 2, 2009

(65) Prior Publication Data

US 2010/0006779 A1    Jan. 14, 2010

(30) Foreign Application Priority Data

Jul. 2, 2008  (JP) ................... 2008-173621

(51) Int. Cl.
*G21K 5/10*    (2006.01)
(52) U.S. Cl. ............. 250/492.21; 250/492.1
(58) Field of Classification Search ............ 250/492.21, 250/491.1, 489
See application file for complete search history.

(56) References Cited

U.S. PATENT DOCUMENTS

| 5,930,643 | A | 7/1999 | Sadana et al. | |
|---|---|---|---|---|
| 6,794,662 | B1 | 9/2004 | Leavitt et al. | |
| 6,863,736 | B2 * | 3/2005 | Leavitt et al. | ................. 118/730 |
| 7,812,325 | B2 * | 10/2010 | Buonodono et al. | ...... 250/492.21 |
| 2009/0057811 | A1 | 3/2009 | Murakami et al. | |
| 2009/0130816 | A1 | 5/2009 | Takahashi et al. | |

FOREIGN PATENT DOCUMENTS

JP    2003-45371    2/2003

OTHER PUBLICATIONS

English language Abstract of JP 2003-45371, Feb. 14, 2003.

* cited by examiner

*Primary Examiner* — Matthew Luu
*Assistant Examiner* — Jason McCormack
(74) *Attorney, Agent, or Firm* — Greenblum & Bernstein P.L.C.

(57) ABSTRACT

This ion implantation apparatus is provided with a holding devise which holds the wafer, and which turns it along its circumference. In addition to holding the wafer at a prescribed position, the ion implantation apparatus subjects the wafer to ion implantation in regions where there is partial overlap of its circumference. The holding devise turns and inclines the wafer, and also holds the wafer by three or more holding pins. The side face of the holding pin has an inversely tapered shape, and the multiple holding pins include a first holding pin whose protrusion amount is relatively small, and a second holding pin whose protrusion amount is relatively large. The holding pin which is on the upper side from the center of the wafer in the planar direction of the inclined wafer is the second holding pin, and the angle of inclination of the side face of the second holding pin at a position where ions are implanted into the wafer has an angular degree which is equal to or less than an angle of incidence of the ion beam relative to the wafer.

5 Claims, 9 Drawing Sheets

ION IMPLANTATION APPARATUS AND ION IMPLANTATION METHOD

BACKGROUND OF THE INVENTION

1. Field of the Invention

The present invention relates to an ion implantation apparatus which implants ions into substrates such as silicon wafers, and in particular to an ion implantation apparatus and ion implantation method which combine prevention of wafer droppage in replacement operations and inhibition of pin mark occurrence.

Priority is claimed on Japanese Patent Application No. 2008-173621, filed Jul. 2, 2008, the content of which is incorporated herein by reference.

2. Description of Related Art

From the standpoint of fabrication of semiconductor devices which have high speed and low power consumption, SOI (Silicon on Insulator) substrates are the focus of attention. SOI substrates have embedded oxide film with excellent insulation properties, and a thin silicon layer (SOI layer) which covers this. In SOI substrates, this silicon layer is used as the active layer, thereby enabling achievement of semiconductor devices with higher integration, lower power consumption, higher speed, high reliability, and so on.

This type of SOI substrate is manufactured by the bonding method that bonds together two wafers with interposition of oxide film, and SIMOX (Separation by Implanted Oxygen) method, or the like (e.g., see the Specification of U.S. Pat. No. 5,930,643). With the SIMOX method, an ion implantation apparatus is used, and oxygen ions are implanted into silicon wafers in a heating environment on the order of 400-600° C., after which an oxide film is formed within the silicon wafer by higher heating (annealing) to manufacture the SIMOX wafer (SOI substrate). As an ion implantation apparatus which uses the SIMOX method, there is, for example, the one disclosed in Japanese Unexamined Patent Application, First Publication No. 2003-45371.

The ion implantation apparatus recorded in Japanese Unexamined Patent Application, First Publication No. 2003-45371 has a wheel-type substrate support member, substrate holders which are provided with interposition of a hub and arms of the substrate support member, and a beam liner which generates an ion beam. The wafer is held by the substrate holder on a wafer conveyor which is an accessory to the ion implantation apparatus, and is scanned with an ion beam by the rotation of the substrate support member and the oscillation of the hub. After the treatment surface of the wafer has been implanted with ions by irradiation with an ion beam, the wafer is carried to the conveyor by the rotation of the substrate support member, and is discharged.

In the Specification of U.S. Pat. No. 6,794,662, a configuration is proposed wherein the substrate holder of ion implantation apparatus adopts a pin structure which holds the wafer with multiple substrate holding pins; holding is accomplished by having the multiple substrate holding pins contact the circumferential edge of the wafer. In an ion implantation apparatus provided with this structure, the wafer holding mechanism in the substrate holder can be simplified, the contact area of the wafer and the substrate holder can be reduced, and damage to the wafer due to rubbing during holding of the wafer can be inhibited.

Moreover, the substrate holding pins of the Specification of U.S. Pat. No. 6,794,662 are formed with thermohardening resin. In the case where the substrate holding pins are formed with metal material, metal sputtering occurs due to irradiation of the substrate holding pins with an ion beam, risking contamination of the wafer. However, when the substrate holding pins are formed with resin material, there is no risk of such contamination, and satisfactory ion implantation is possible.

As the most important specification of SOI substrates, there is the layer thickness of the SOI layer, which is separated from the bulk of the silicon wafer by the oxide film. As the layer thickness of the SOI layer has major effects on the conditions of the device fabrication process using an SOI substrate and on device properties, it is not only required that layer thickness be as designed, but also that the SOI substrate be of uniform thickness so that disparities in the layer thickness of the SOI layer within the wafer are non-existent to the extent possible.

With the ion implantation apparatus of the Specification of U.S. Pat. No. 6,794,662, a structure is adopted wherein a recess or taper is provided on the side face of the substrate holding pins, the wafer is engaged, and holding of the wafer is stably conducted. However, in the case of such the structure, a portion of the substrate holding pin protrudes over (planarly overlaps) the treatment surface of the wafer, with the result that the substrate holding pin blocks the ion beam with this protruding portion. When this occurs, ion implantation of the portions that are shaded by the substrate holding pins is obstructed, giving rise to sites of ion implantation deficiency called "pin marks". When this occurs, layer thickness disparities arise in the SOI layer that is formed, with the result that usable wafer surface area is reduced.

In order to prevent pin mark occurrence, it is conceivable to reduce the portion of the substrate holding pin that protrudes over the wafer. However, in the case where the portion of the pin protruding over the wafer is small, the holding of the wafer is unstable. In addition, ion implantation treatment is conducted in a heated environment, and the environmental temperature during this time is a temperature that is equal to or greater than the glass transition temperature of ordinary thermohardening resin, with the result that substrate holding pins of resin material tend to soften, and holding tends to loosen. In this case, there is a risk that the following type of problem may occur.

As wafer conveyance is easy, wafers are often moved/conveyed in a state where their planar direction is horizontal. In contrast, in an ordinary ion implantation apparatus, in order to prevent the wafer from undergoing warpage or deformation due to its own weight in a high temperature environment, the wafer is raised upright from its horizontal state, and ion implantation is conducted. Consequently, in an ion implantation apparatus, it is frequently the case that an untreated wafer is horizontally loaded, after which operations are conducted whereby the wafer is turned, and raised upright. In the case where such turning operations are conducted, the wafer tends to fall off when holding by the substrate holding pins loosens.

With respect to such turning operations, when cooling is conducted, for example, until 250° C. or less, and replacement operations are conducted, the resin that was softened at high temperature is cooled, and its flexural strength is restored, enabling prevention of wafer droppage. However, in this case, time is required for cooling, and reheating is required for the ion implantation treatment that is to subsequently follow, resulting in reduced productivity.

The present invention was made in light of such circumstances, and its object is to offer an ion implantation apparatus and ion implantation method which make it possible to combine prevention of wafer droppage in replacement operations and inhibition of pin mark occurrence at the periphery of the holding pins.

SUMMARY OF THE INVENTION

The ion implantation apparatus of the present invention is provided with a holding devise which holds a wafer, and which turns the wafer along its circumference. The holding devise holds the surface of the wafer at a prescribed position while inclining it relative to a circumferential plane of the circumference. In a region which differs from the prescribed position and which overlaps with a portion of the circumference, the wafer is subjected to ion implantation using an irradiating ion beam. In this type of ion implantation apparatus, the holding devise turns the wafer that is held around a rotational axis (second rotational axis) that extends in a diametrical direction of the circumference, and inclines the wafer, and three or more holding pins with which the holding devise is provided are brought into contact with the circumferential edge of the wafer to hold the wafer. The holding pins are formed using formation material which includes thermohardening resin or photohardening resin. The side faces of the holding pins are formed so that they contact the circumferential edge of the wafer, and are provided with an inversely tapered inclination in a direction that recedes from the site of contact with the wafer. The length of a line that extends from the contact site of the holding pin and the circumferential edge of the wafer toward the center axis of the wafer in a region where the holding pin and the wafer planarly overlap is considered to be the amount of protrusion of the holding pin. The plurality of the holding pins include a first holding pin where the protrusion amount is relatively small, and a second holding pin where it is relatively large. The second holding pin is the holding pin which is positioned on the upper side from the center of the wafer in the inclined planar direction of the wafer. The angle of inclination of the side face of the second holding pin relative to a line that is parallel to the center axis of the wafer is an angle which is equal to or less than the angle of incidence which is the inclination of the ion beam relative to the center axis of the wafer.

When the wafer is inclined by turning movement, in the vicinity of the holding pins which are positioned upward relative to the center of the wafer, the force which retains the wafer that is attempting movement in the direction of the turning motion is due to physical contact from the protruding portion of the holding pins and the wafer. Consequently, when the holding pins of resin manufacture soften in a heating environment, retention by the protruding portion tends to loosen. According to the configuration of the present invention, holding force is enhanced by attachment of a second holding pin which has a relatively larger protrusion amount than the other holding pins among the holding pins of the portion. Consequently, in the present invention, compared to the case where all holding pins have the same protrusion amount, it is possible to reinforce the holding force of the holding pins that are positioned upward, and inhibit droppage.

As control is conducted so that the angle of inclination of the side face of the second holding pin is less than the angle of incidence of the ion beam, the second holding pin does not create a shadow relative to the ion beam, and a pin mark does not occur in the vicinity of the second holding pin with the large holding force.

Accordingly, according to the above type of configuration, it is possible to have an ion implantation apparatus which enables prevention of wafer droppage during replacement operations, which enables inhibition of pin mark occurrence in the vicinity of the second holding pin, and which enables satisfactory conduct of ion implantation.

Otherwise, in the present invention, the circumferential edge of the wafer signifies the plane in the thickness direction which binds the edges of the front and rear faces of the wafer, and the portion where the boundary of these is beveled (grinded). Moreover, the angle of incidence of the ion beam indicates the angle that is constituted by the center axis of the wafer and the optical axis of the ion beam, assuming the case where incidence occurs in a direction parallel to the center axis direction of the wafer to be 0°.

In the present invention, it is preferable that the protusion amount of the first holding pin be 0.1 mm or more and less than 0.2 mm, and that the protrusion amount of the second holding pin be 0.2 mm or more and 0.4 mm or less.

When the protrusion amount of the first holding pin is less than 0.1 mm, the wafer holding force is weak, because the contact of the holding pin and the wafer due to the protruding portion is small; and when it is 0.2 mm or more, the protrusion amount is excessive, and pin marks tend to occur. When the protrusion amount of the second holding pin is less than 0.2 mm, the wafer holding force is weak; and when larger than 0.4 mm, pin marks tend to occur.

According to the above type of configuration, it is possible to combine satisfactory holding of the wafer and inhibition of pin mark occurrence.

In the present invention, it is preferable that the angle of incidence be 5° or more and 20° or less.

As a result of study by the inventors, it was found that it is preferable to provide an angle of inclination of 5° or more in order to have satisfactory holding conducted by the holding pins. When the angle of incidence of the ion beam is less than 5° while an angle of inclination enabling satisfactory holding is provided, a protruding portion is produced wherein the second holding pin blocks the ion beam, and pin marks are created in the wafer after ion implantation. Moreover, it is unsuitable when the inclination of the wafer holder is larger than 20°, because it is difficult to conduct ion implantation into the interior of the wafer. According to the above type of configuration, ion implantation treatment can be satisfactorily conducted.

According to the present invention, by changing the shape of the holding pins according to their positional arrangement in the holding member, it is possible to offer an ion implantation apparatus which combines prevention of wafer droppage and inhibition of pin mark occurrence in the vicinity of the holding pins.

DETAILED DESCRIPTION OF THE INVENTION

Figure 1A:
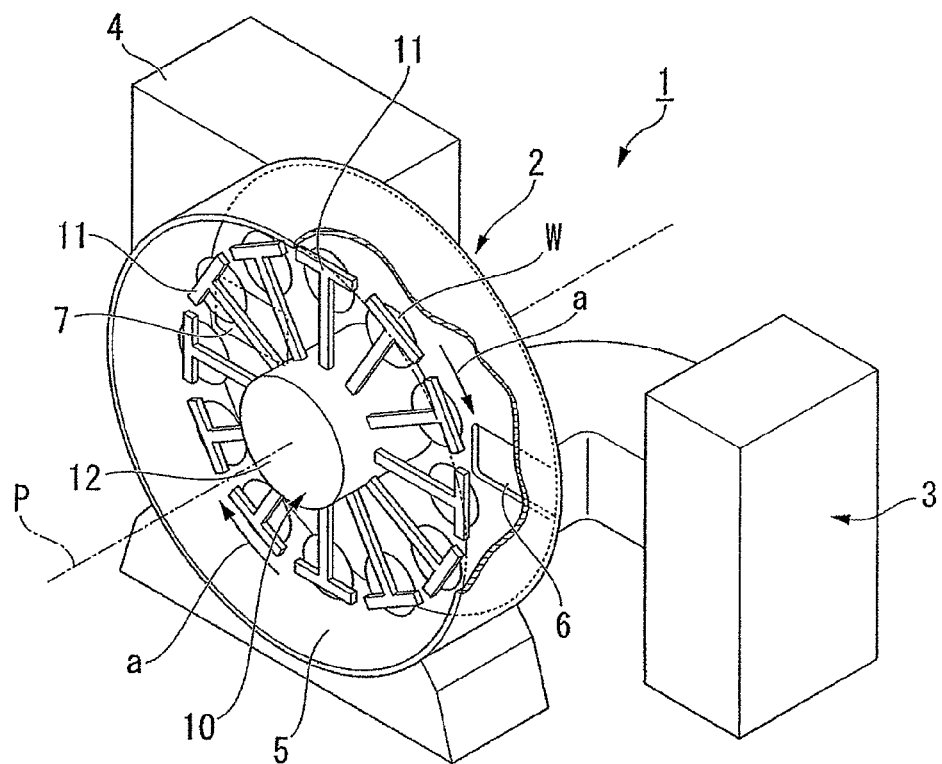
FIG. 1A is a perspective view which shows the ion implantation apparatus of the present invention.

The ion implantation apparatus of an embodiment of the present invention is described below with reference to FIG. 1A to FIG. 8. Here, the ion implantation apparatus of the present embodiment is described as one which uses the SIMOX method to fabricate a SOI substrate by implanting oxygen ions into a silicon wafer. In all of the following drawings, the layer thicknesses and dimensional proportions of each component element are suitably varied in order to facilitate viewing of the drawing.

Figure 1B:
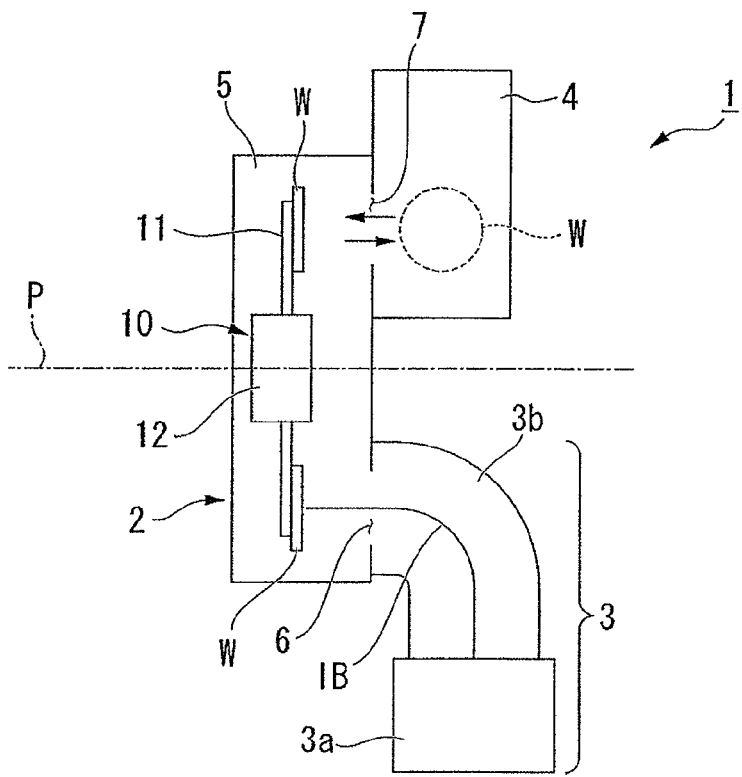
FIG. 1B is a sectional view which shows the ion implantation apparatus of the present invention.

FIG. 1A and FIG. 1B are diagrams which show an ion implantation apparatus 1 of the present embodiment. FIG. 1A is a perspective view, and FIG. 1B is a schematic drawing which shows the operation of the ion implantation apparatus 1.

As shown in FIG. 1A, the ion implantation apparatus 1 is provided with an ion implanter 2 which conducts ion implantation relative to a wafer W, an ion beam generator 3 which generates the ion beam that irradiates the wafer W, and a wafer conveyor 4 which conveys the wafers W into and out from the chamber 5 with which the ion implanter 2 is provided. A holding member (holding devise) 10 which holds multiple wafers W is disposed inside the chamber 5.

In a side wall of the chamber 5 is provided an emission port 6 of the ion beam that is generated by the ion beam generator 3. Inside the chamber 5 during ion implantation, pressure is reduced to a prescribed vacuum by a vacuum pump that is not illustrated in the drawings, and heating is conducted to a temperature suitable for ion implantation. In the side wall of the chamber 5, at a different position from that of the emission port 6, a conveyance port 7 is provided which discharges wafers W from the chamber 5 that have completed ion implantation treatment, and which feeds untreated wafers W into the chamber 5.

In greater detail, at least one each of the ion beam emission port 6 and the wafer conveyance port 7 are concentrically provided in either one of the faces of the approximately circular side walls which the approximately cylindrical chamber 5 has.

A holding member 10 is provided inside the chamber 5. The holding member 10 includes a hub 12 capable of rotating around a first rotational axis P, and multiple wafer holders 11 which are provided on the hub 12 and which hold wafers.

In the holding member 10, a wafer W is held at one end of each wafer holder 11, while the other end of each wafer holder 11 is connected to the hub 12. The multiple wafer holders 11 are provided so as to radially extend from the hub 12. The holding member 10 is configured so that the multiple wafer holders 11 and the wafers W held by the wafer holders 11 are turned by the rotation of the hub 12 around a first rotational axis P in the direction of arrow mark a. The holding member 10 is turned, for example, at 70 rpm.

There are no particular limitations on the number of the multiple wafer holders 11 in the holding member 10, but it is preferable that at least more than one wafer holder 11 be installed, and twelve can be installed as shown in FIG. 1.

The emission port 6 and the rotational circumference of the multiple wafers W that are held by the holding member 10 are arranged so as to planarly overlap, and the ion beam emitted from the emission port 6 irradiates the multiple wafers W in conjunction with rotation of the holding member 10. That is, the arrangement is such that a line extending from the center of a wafer W that is held by the holding member 10 toward the first rotational axis P has approximately the same length as a line extending from the approximately central part of the emission port 6 that is provided in one of the wall faces of the chamber 5 toward the first rotational axis P. In the ion implantation apparatus 1 of the present embodiment, oxygen ions originating in oxygen plasma are generated by the ion beam generator 3, and oxygen ion implantation is conducted with respect to the wafers W.

The conveyance port 7 is also arranged so as to planarly overlap with the rotational circumference of the multiple wafers W. The conveyance port 7 is provided on the opposite side from the emission port 6 with interposition of the hub 12. That is, it is arranged such that a line extending from the center of a wafer W that is held by the holding member 10 toward the first rotational axis P has approximately the same length as a line extending from the approximately central part of the conveyance port 7 that is provided in one of the wall faces of the chamber 5 toward the first rotational axis P. At a position where the wafer W and the conveyance port 7 planarly overlap (a prescribed position), replacement operations are conducted whereby a wafer W that has completed ion implantation treatment is removed, and an untreated wafer W is loaded.

As shown in FIG. 1B, the ion beam generator 3 has an ion generator 3a which generates ions for implantation by causing gas to undergo electric discharge and enter a plasma state, and a mass spectrometry system 3b which generates a magnetic field that affects ion species that transit its interior, and which removes only ion species of the desired mass. The ions generated by the ion generator 3a are extracted by an extraction electrode that is not illustrated in the drawings, and are accelerated, after which they constitute an ion beam IB which contains only the desired ion species as a result of passage through the mass spectrometry system 3b. At a position where a wafer W is superimposed on the opening 6 when viewed from a direction parallel to the first rotational axis P, the ion beam IB radiates toward the wafer W held by a wafer holder 11, and the wafer W undergoes ion implantation.

A wafer W that has completed ion implantation is moved to a position where it overlaps with the conveyance port 7 when viewed in a direction parallel to the first rotational axis P by turning of the holding member 10 centering on the first rotational axis P in direction a, after which it is removed from the interior of the chamber 5 by the wafer conveyor 4. After removal of the wafer W that has completed ion implantation, the wafer conveyor 4 loads a new wafer onto the wafer holder 11, and ion implantation treatment is similarly conducted with respect to the new wafer W.

The ion implantation apparatus 1 also has accessories such as a mechanism for rotating the holding member 10, and a beam stopper that is arranged opposite the emission port 6 with interposition of the holding member 10, but these are omitted from FIG. 1.

Figure 2:
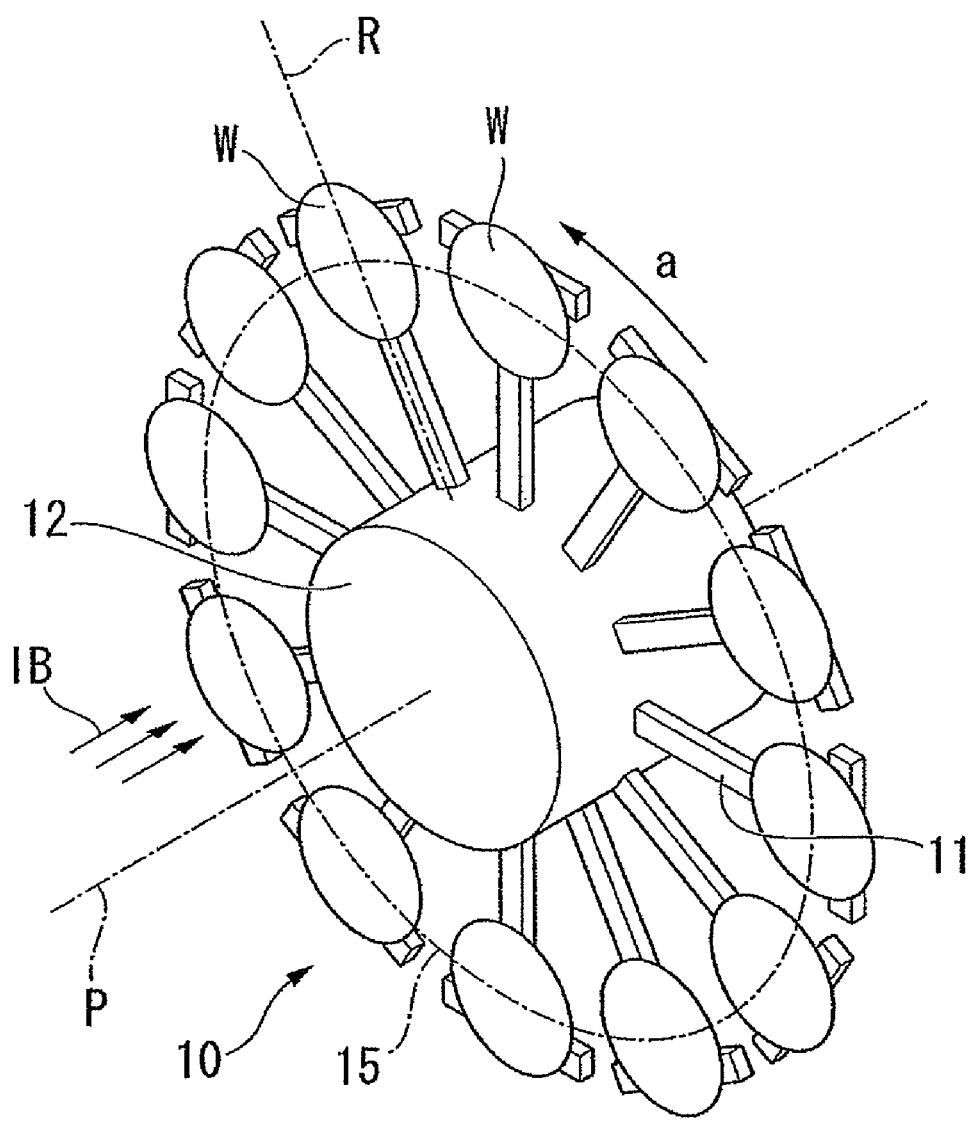
FIG. 2 is a schematic perspective view which shows the holding member with which the ion implantation apparatus of the present invention is provided.

FIG. 2 is a schematic perspective view which shows the holding member 10 which is the primary component of the ion implantation apparatus 1, and is a perspective view wherein the holding member 10 of FIG. 1A is seen from its wafer face back side with a frontal view of the wafer face.

The holding member 10 is configured so as to hold multiple wafers W on a virtual circumference 15 that is centered on the rotational axis (first rotational axis P) of the hub 12. The ion beam IB that is emitted from the emission port 6 irradiates a region which overlaps with the circumference 15 where the wafers W are disposed when viewed in a direction parallel to the first rotational axis P. By turning the holding member 10 in direction of arrow mark a, the multiple wafers W successively transit the region that is irradiated by the ion beam IB, and ion implantation is conducted with respect to all of the wafers W.

By having a structure of holding pins (described below) which are provided in the portion where wafer holders 11 hold wafers W, and by controlling the angle of the wafers W relative to the irradiating ion beam IB, the ion implantation apparatus 1 of the present invention combines the prevention of wafer droppage during wafer replacement operations and the inhibition of pin mark occurrence. The details are described below.

Figure 3A:
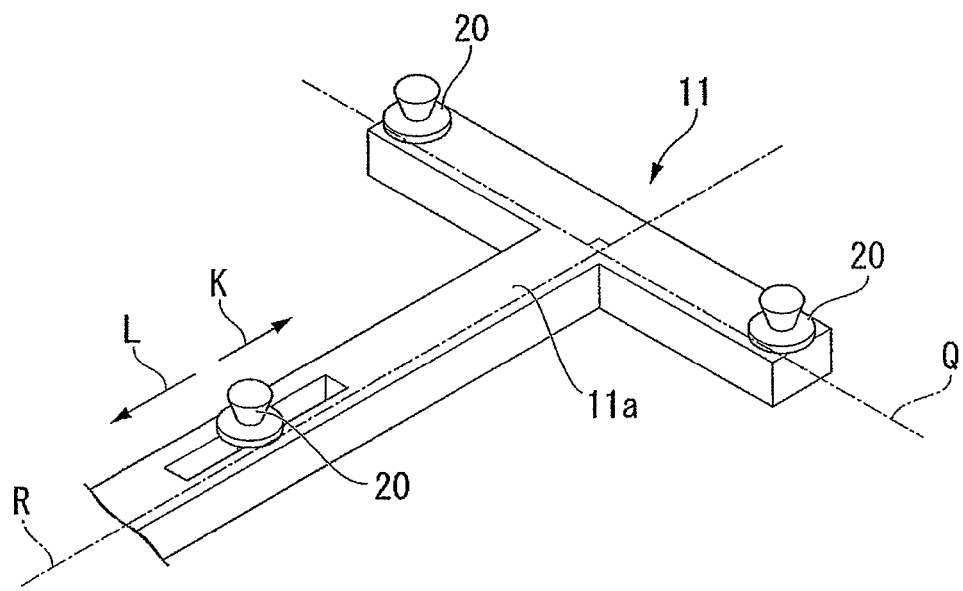
FIG. 3A is a perspective view which shows a wafer holder in the holding member.
Figure 3B:
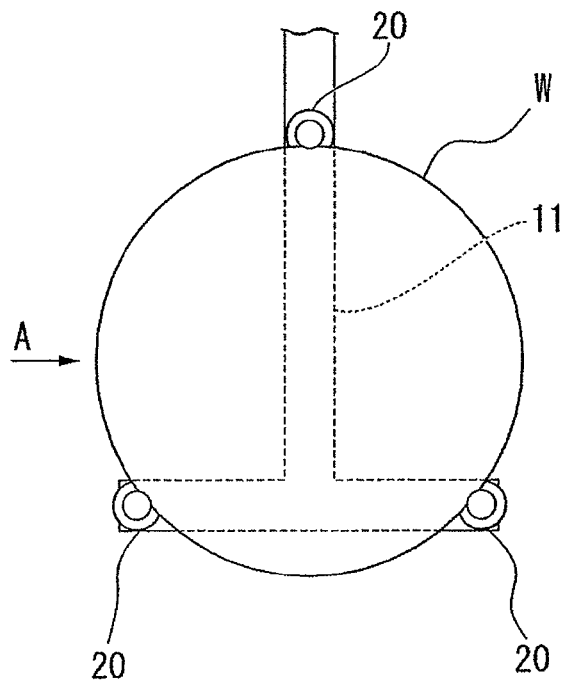
FIG. 3B is a front elevational view which shows a wafer holder in the holding member.
Figure 3C:
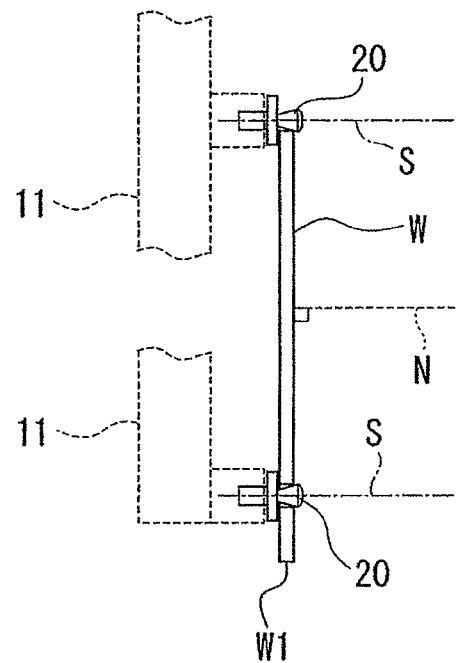
FIG. 3C is a side view from the A direction which shows a wafer holder in the holding member.

FIG. 3A and FIG. 3B are schematic views which show a wafer holder 11 in the holding member 10. FIG. 3A is a schematic perspective view of the wafer holder 11. FIG. 3B is a frontal elevation view along the center axis N of the wafer W which views the treatment surface side (ion beam irradiation surface) of the wafer W in a state where the wafer W is held. FIG. 3C is a side view from the direction of arrow mark A of FIG. 3B.

As shown in FIG. 3A, the wafer holder 11 has a support body 11a which is approximately T-shaped under a planar view along the center axis N of the wafer W, and holding pins 20 provided at three places on the support body 11a. With respect to the support body 11a which is approximately T-shaped under planar view, two of the holding pins 20 are affixed to the two ends of the portion that constitutes the transverse line of the T-shape, and the remaining one is provided on the portion that constitutes the vertical line of the T-shape so that it is capable of movement along the vertical line.

That is, in the case, for example, of three holding pins, one of the holding pins is provided on a second rotational axis R which crosses the first rotational axis P. On a third axis Q which is orthogonal to the second rotational axis R, the remaining two holding pins are provided such that the second rotational axis R is interposed between them. Furthermore, it is preferable that the holding pin which is provided on the second rotational axis R be in a state where it is capable of movement in a direction L or a direction K that parallels the second rotational axis R. Moreover, the support body 11a is capable of rotation centering on the second rotational axis R.

As shown in FIG. 3B, when a wafer W is to be held, the mobile holding pin 20 is moved toward the side of the other two fixed holding pins, and the wafer W is sandwiched by the mobile holding pin and the fixed holding pins thereby achieving a configuration wherein the wafer W is supported at 3 points, and is held at a fixed position. At this time, each holding pin is in contact with the outer periphery of the wafer.

As shown in FIG. 3C, the holding pins 20 are provided so that an axis line N of the wafer W and axis lines S of the holding pins 20 are parallel in a state where the wafer W is held at its circumferential edge W1.

Figure 4A:
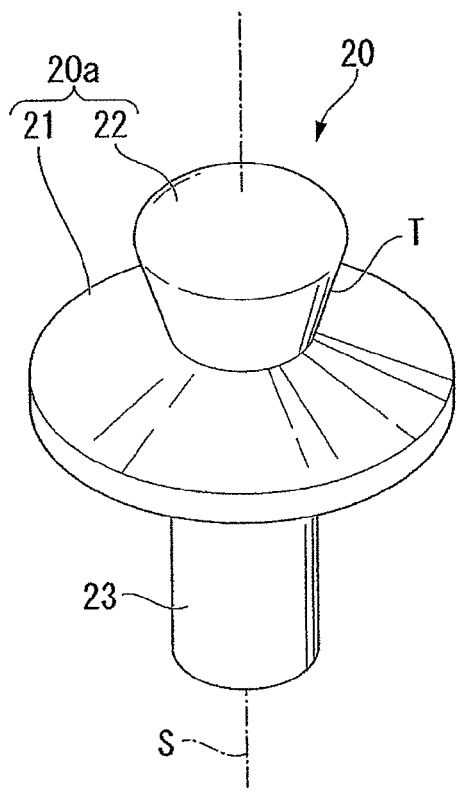
FIG. 4A is a perspective view which shows the holding pins of the wafer.
Figure 4B:
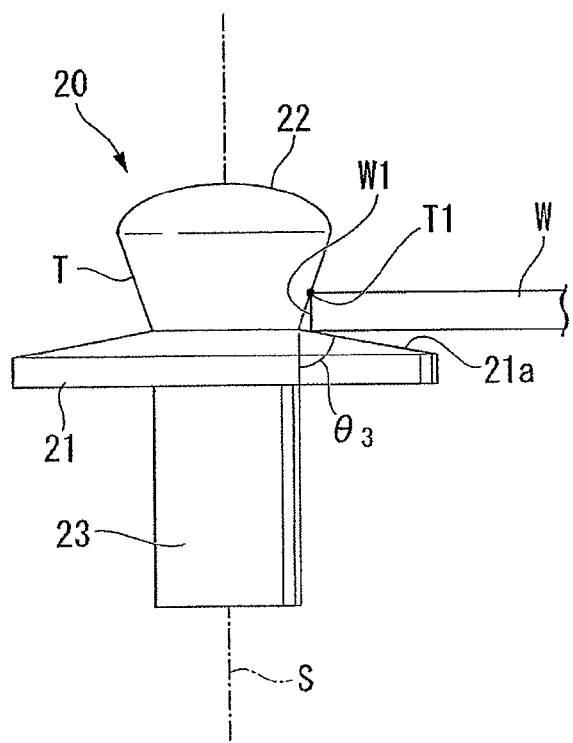
FIG. 4B is a side view which shows the holding pins of the wafer.
Figure 4C:
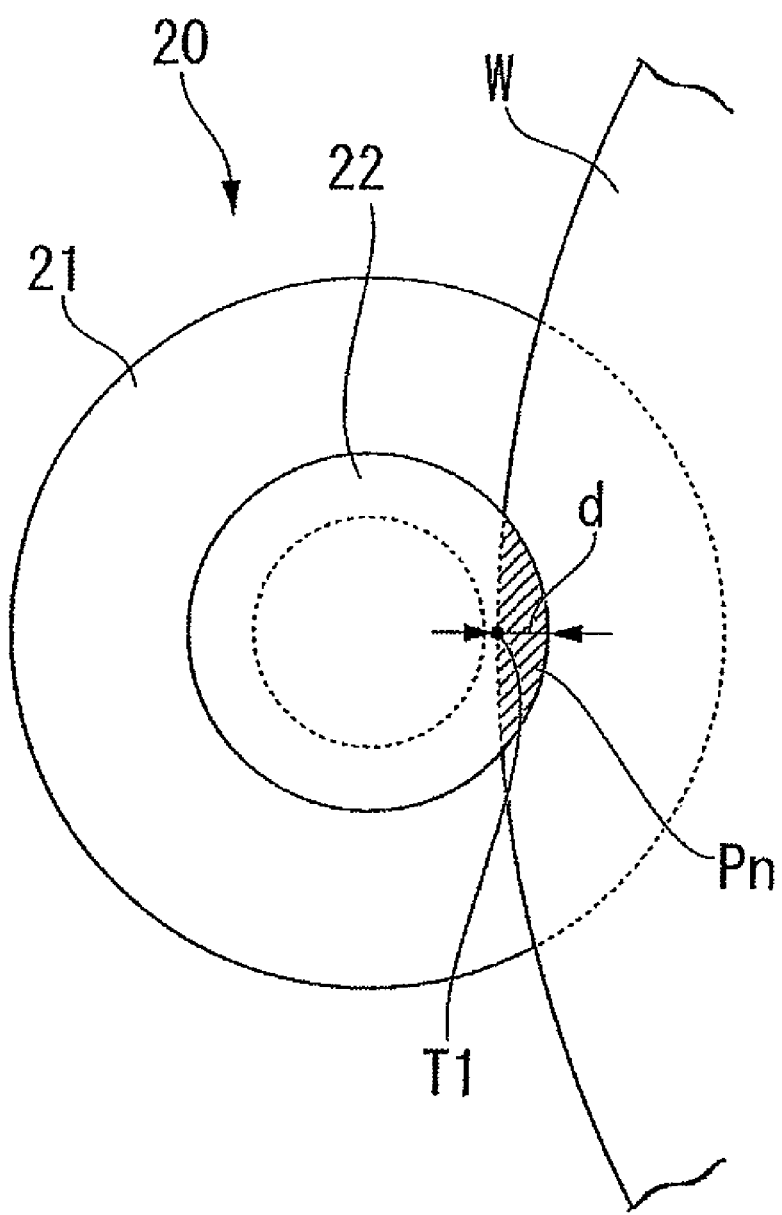
FIG. 4C is a plan view which shows the holding pins of the wafer.

FIG. 4A to FIG. 4C are explanatory views of the holding pin 20. FIG. 4A is a perspective view, FIG. 4B is a side view of the state where the wafer W is held, and FIG. 4C is a plan view of the state where the wafer W is held.

As shown in FIG. 4A, the holding pin 20 has a wafer holder 20a which contacts the wafer W and which holds the wafer W, and an approximately cylindrical fixed part 23 of which one end connects to the wafer holder 20a, and the other end connects to the wafer holder 11 that is not illustrated in the drawing. The wafer holder 20a has a flange 21 which opposes the surface of the wafer W that is on the opposite side of the treatment surface, and a holder 22 which projects from the surface of the flange 21 that is on the opposite side relative to the fixed part 23, and which contacts the circumferential edge W1 of the wafer W. The cross-sectional shape of the holder 22 is approximately circular when viewed from a direction that is parallel to the wafer center axis N. A side face T of the holder 22 has an inversely tapered shape in a direction that recedes from the flange 21. That is, when the wafer W is fixed to the support body 11a by the respective holding pins 20 for the purpose of conducting ion implantation with respect to the wafer W, the side face T of each of the holding pins 20 has a first inclined side face which contacts the outer periphery of the wafer, which is oriented toward the treatment surface of the wafer, and which slants so that it draws nearer to the center axis of the wafer as its distance from the wafer holder 11 increases. The holding pins 20 are provided with rotational symmetry centering on the axis line of the fixed part 23 (axis line S of the holding pin).

The holding pins 20 can be formed using thermohardening resin that is capable of use over long periods in high-temperature environments. As thermohardening resin, one may suitably use, for example, super engineering plastics such as polyimide resin, polyamide imide resin, and polyether ether ketone (PEEK). Furthermore, it is also acceptable to conduct formation with composite material of thermohardening resin and graphite. In the case of use of composite material, one may obtain a holding pin 20 by molding the shape of the holding pin 20 with resin, and subsequently carbonizing the surface by conducting treatment for 20-30 minutes under heating conditions of 200-300° C. in a reductive atmosphere, with the result that graphite is provided over the entire surface, and the interior is resin; or one may form the holding pin 20 from composite material in which graphite particles with particle size on the order of 10-100 μm are uniformly dispersed in resin. It is also possible to use photohardening resin, instead of thermohardening resin.

With respect to the various dimensions of the holding pin 20, in the case of, for example, holding pins which are used to hold wafers having a diameter of 300 mm, the diametric dimensions of the flange 21 would be 10 mm to 30 mm, the thickness dimensions of the flange 21 would be 3 mm to 5 mm, the diametric dimensions of the holder 22 would be 5 mm to 10 mm, and the height dimensions of the holder 22 would be 5 mm to 15 mm, and as for the fixed part 23, it would have the same diameter as the holder 22, and height dimensions would be 10 mm to 30 mm.

In cases where wafers of other dimensions are held, there are no particular limitations, but it is preferable that the ratio of the respective dimensions of the holding pin relative to the diameter of the wafer be approximately the same as in the case of a wafer having a diameter of 300 mm.

As shown in FIG. 4B, the surface 21a of the flange 21 on the holder 22 side (the side on which the wafer is held) forms a shape which gradually tapers from the axis line S of the holding pin toward the circumferential edge of the holding pin. That is, when the wafer W is fixed to the support body 11a by the respective holding pins 20 for the purpose of conducting ion implantation with respect to the wafer W, the surface 21a of the flange 21 forms a second inclined side face which contacts the outer periphery of the wafer, which is oriented toward the non-treatment surface side of the wafer, and which slants toward the center axis N of the wafer as its distance from the wafer holder 11 increases. It is preferable that an angle of inclination θ3, which is formed on the surface 21a by the second inclined side face and a line that is parallel to the axis line S of the holding pin, be 80° or more and 89° or less; and 85° or more and 88° or less is more preferable. The holding pin 20 engages with the circumferential edge W1 of the wafer W at a recess that is formed between the tapered surface 21a and the side face T of the inversely tapered holder 22. The side face T and the circumferential edge W1 of the wafer W come into contact at a contact part (contact site) T1, constituting a configuration which holds the wafer W.

As shown in FIG. 4C, in the state where the wafer W is held, a portion of the holder 22 protrudes over the treatment surface of the wafer W. In the case where the wafer W that is held by the holding pins 20 is subjected to ion implantation by an ion beam from the center axis direction of the wafer W (the direction of the wafer center axis N), the protruding portion Pn which is the portion of the holder 22 that is orthogonally projected onto the wafer W is observed as a pin mark of a protrusion amount d (a portion where ions are not implanted). Here, in the case where one assumes a straight line extending from the contact part T1 toward the center of the wafer W, the protrusion amount d of the protruding portion Pn indicates the length of the straight line in the protruding portion Pn. That is, the protrusion amount d is a value which shows the amount of the portion of apparent overlap of the wafer W and the holding pin 20 when the wafer W is viewed along the center axis N of the wafer W. The protrusion amount d is shown in terms of diametric length of the wafer W extending from the center axis N of the wafer W toward the outer periphery of the wafer W. In particular, with regard to the respective protruding portions Pn, the longest portion among the diametric lengths of the overlapping portions is used as the value of the protrusion amount d.

The fundamental shape of the holding pins 20 which are used in the present invention is as described above.

In the present invention, in order to solve the problem, the shape of the holder 22 varies according to the positional arrangement of the holding pins 20 in the wafer holder 11, and two types of holding pin—a first holding pin 20A and a second holding pin 20B—are used. Below, using FIG. 5 and FIG. 6, a description is given of the shape and arrangement of the holding pins with holders 22 of different shape, after which a description is given of the effects produced by the holding pins of different shape using FIG. 7 and FIG. 8.

Figure 5A:
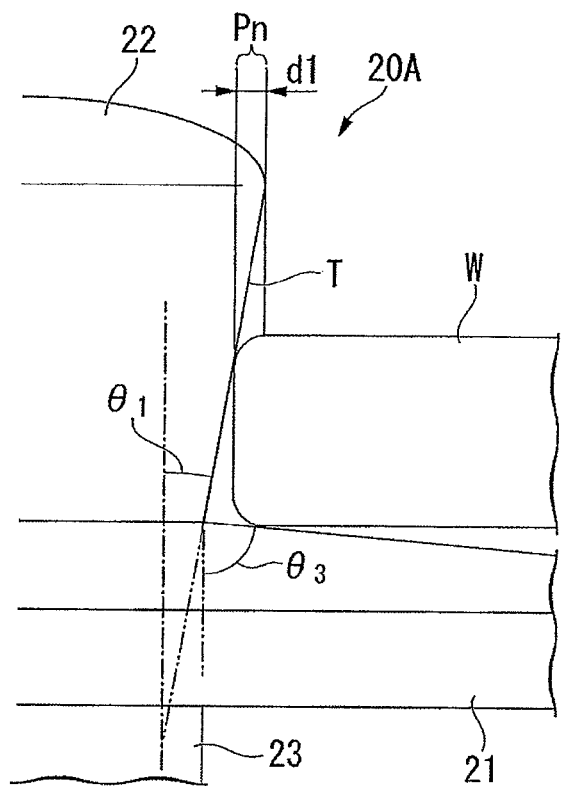
FIG. 5A is an enlarged view of the vicinity of the side face of the holder of the first holding pin.
Figure 5B:
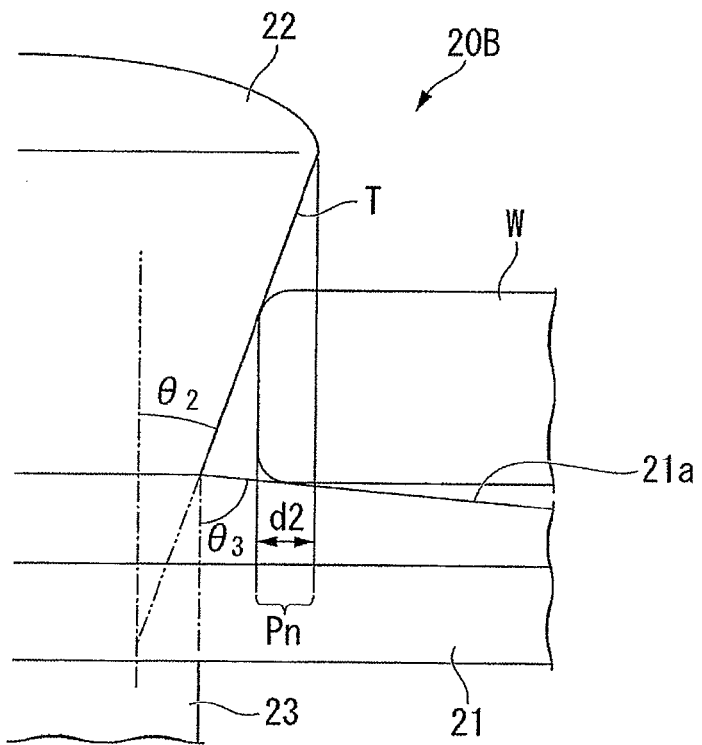
FIG. 5B is an enlarged view of the vicinity of the side face of the holder of the second holding pin.

FIG. 5 is an enlarged view of the vicinity of a holder 22 of a holding pin 20. FIG. 5A and FIG. 5B respectively show a first holding pin 20A and a second holding pin 20B which have holders 22 of different shape. The first holding pin 20A and second holding pin 20B are identical in shape except for differing angles of inclination of the side face T of the holder 22, and the second holding pin 20B is configured to have a larger protrusion amount than the first holding pin 20A. In the present embodiment, height in parallel to the wafer center axis N is made identical with respect to the first holding pin 20A and second holding pin 20B. However, if the protruding portion Pn of the first holding pin 20A is smaller than the protruding portion Pn of the second holding pin 20B, there is no particular need to limit the height of the holding pins.

As shown in FIG. 5A, the side face T of the holder 22 of the first holding pin 20A has an inversely tapered shape which is vertically inclined proportionate to an angle of inclination θ1. That is, in the first holding pin, the angle of inclination of the first inclined side face relative to a line that parallels the center axis of the wafer is θ1. When this type of first holding pin 20A engages with the wafer W, a protruding portion Pn with a protrusion amount d1 occurs. With respect to the angle of inclination θ1 of the first holding pin 20A, it is preferable that an angle be selected so that the protrusion amount d1 is 0.1 mm or more and is less than 0.2 mm. In the present embodiment, the angle of inclination θ1 is set at 5°, and the protrusion amount d1 is set at 0.13 mm.

As shown in FIG. 5B, the side face T of the holder 22 of the second holding pin 20B has an inversely tapered shape with an angle of inclination θ2. That is, in the second holding pin, the angle of inclination of the first inclined side face relative to a line that parallels the center axis of the wafer is θ2. When this type of second holding pin 20B engages with the wafer W, a protruding portion Pn with a protrusion amount d2 occurs. With respect to the angle of inclination θ2 of the second holding pin 20B, it is preferable that an angle be selected so that the protrusion amount d2 is larger than the protrusion amount d1 at 0.2 mm or more and 0.4 mm or less. In the present embodiment, the angle of inclination θ2 is set at 10°, and the protrusion amount d2 is set at 0.25 mm.

Figure 6A:
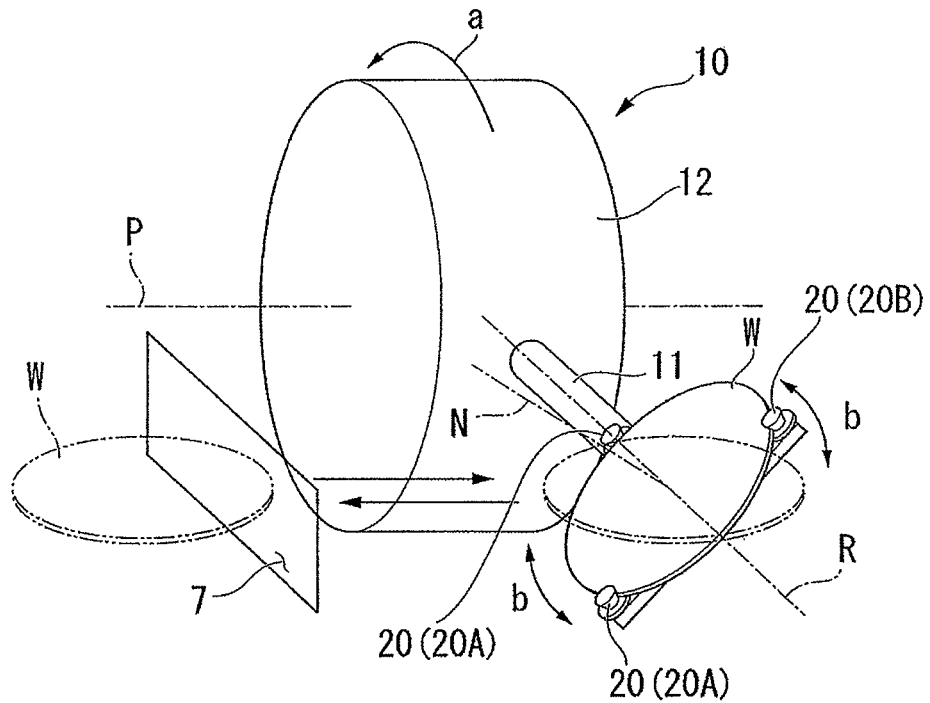
FIG. 6A is a perspective view which shows wafer replacement operation in the ion implantation apparatus.
Figure 6B:
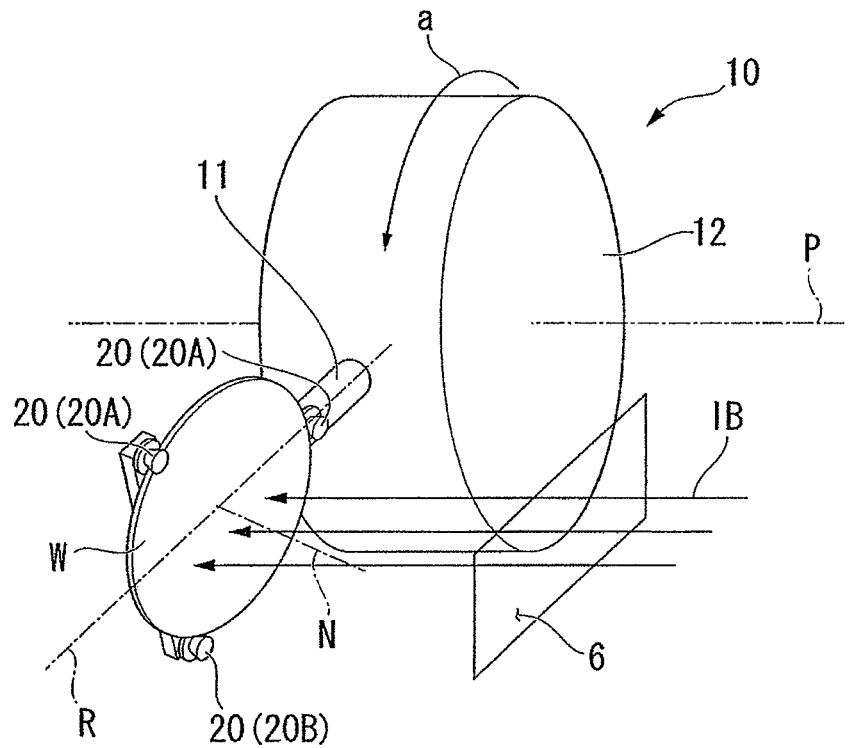
FIG. 6B is a perspective view which shows ion beam irradiation of a wafer in the ion implantation apparatus.

FIG. 6A and FIG. 6B are schematic drawings which show movement of the wafer W in the ion implantation apparatus of the present embodiment. FIG. 6A shows the circumstances of replacement operations pertaining to the wafer W, and FIG. 6B shows the circumstances of ion beam irradiation of the wafer W.

FIG. 6A is an explanatory view which shows the circumstances of removal and loading of the wafers W in the ion implantation apparatus. As shown in the drawing, the holding member 10 horizontally holds an untreated wafer W, which is delivered via the conveyance port 7, in the loading position of the wafer W. This wafer holder 11 is capable of turning around the second rotational axis R. After the wafer W is horizontally loaded, the wafer holder 11 turns around the second rotational axis R, and holds the wafer W so that it is inclined in such a way that the distance in the horizontal direction between the conveyance port 7 and the upper end of the treatment surface is longer than the distance in the horizontal direction between the conveyance port 7 and the lower end of the treatment surface (the axis line N of the wafer W inclines downward as one moves from the conveyance port 7 toward the holding member 10). That is, the wafer holder 11 is inclined by rotating the support body 11a around the second rotational axis R so that, on a line that is parallel to the first rotational axis P, the distance between the conveyance port 7 and the end of the holder 22 of second holding pin 20B is longer than the distance between the conveyance port 7 and the end of the holder 22 of first holding pin 20A. The angle of inclination of the wafer W (the angle constituted by a parallel line of the first rotational axis P and the center axis N of the wafer W) of the present embodiment is 10°. In the ion implantation apparatus of the present embodiment, when the wafer holder 11 turns, the holding pin which is positioned above in the vertical direction is the second holding pin 20B, and the other holding pin is the first holding pin 20A.

The wafer W held in this way is moved in the direction of arrow mark a by the rotation of the hub 12.

FIG. 6B is an explanatory view which shows the circumstances of ion beam irradiation of the wafer W. In the ion implantation apparatus of the present embodiment, ion implantation is conducted at the position on the opposite side from the position where the wafer W is held with interposition of the hub 12.

As shown in the drawing, by turning the wafer W around the hub 12 centering on the first rotational axis P, the vertical positional relations of the arranged holding pins are switched, and the second holding pin 20B is positioned underneath in the vertical direction in the region where ion implantation is conducted. Similarly, the direction of inclination of the wafer W is switched by the turning around the hub 12. Furthermore, irradiation with the ion beam IB that is emitted from the emission port 6 is conducted in a state where the wafer W is inclined in the region where ion implantation is conducted so that the distance in the horizontal direction between the emission port 6 and the lower end of the treatment surface of the wafer W is longer than the distance in the horizontal direction between the emission port 6 and the upper end of the treatment surface (the axis line N of the wafer W inclines upward as one moves from the emission port 6 toward the holding member 10).

That is, it is a state where the wafer holder 11 is inclined by rotating the support body 11a around the second rotational axis R so that, on a line that is parallel to the first rotational axis P, the distance between the emission port 6 and the end of the holder 22 of second holding pin 20B is longer than the distance between the emission port 6 and the end of the holder 22 of first holding pin 20A.

With an ion implantation apparatus of the above-described configuration, the following respective effects are obtained when conducting wafer replacement operations and ion implantation.

Figure 7A:
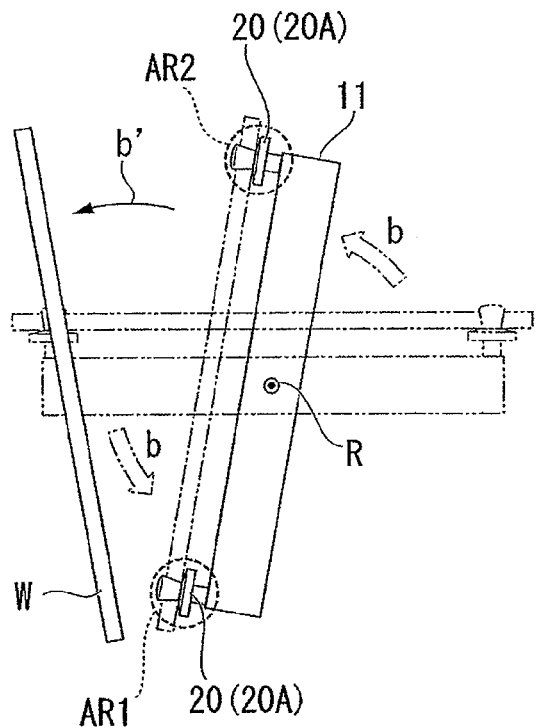
FIG. 7A is a side view of a reference operation which shows actions at the time of wafer replacement in a reference ion implantation apparatus.
Figure 7B:
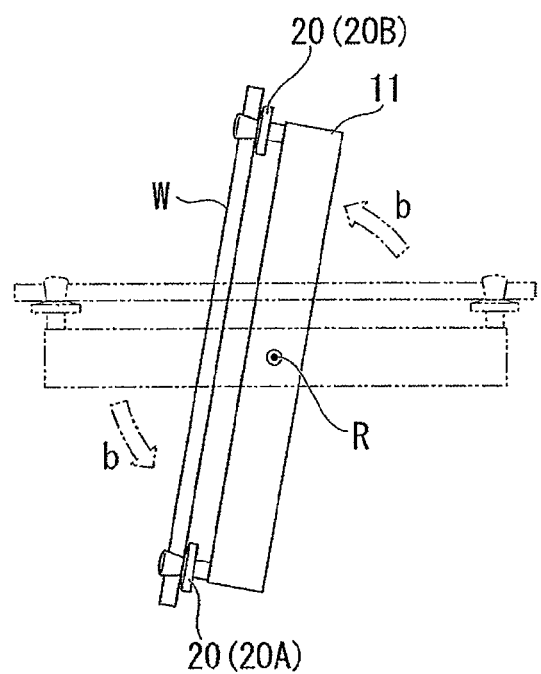
FIG. 7B is a side view which shows actions at the time of wafer replacement in the ion implantation apparatus of the present patent application.

FIG. 7A and FIG. 7B are both explanatory views which show actions at the time of the replacement of the wafer W shown in FIG. 6A. FIG. 7A is an example of a conventional configuration which uses all identical holding pins, and FIG. 7B is an example in which the holding pins of the present embodiment are used.

When the wafer W is raised from a horizontal state to an inclined holding state due to the turning of the wafer holder 11, the wafer W sustains a force that is caused by the angular velocity of a turning motion b. At this time, as shown in FIG. 7A, in the conventional case where identical holding pins are used regardless of positional arrangement (illustrated here by the first holding pin 20A), the grip of the holding pins 20 is loose due to the softening of the holding pins 20 by the heating environment, and there is a risk of disengagement and droppage of the wafer W.

When the wafer W is turned centering on the second rotational axis R, in the vicinity of the holding pin 20 which is positioned underneath in the vertical direction (the area surrounded by broken line AR1 in the drawing), a force due to angular velocity presses against the wafer W in the direction of the wafer holder 11, with the result that holding is not loosened much. In contrast, in the vicinity of the holding pin 20 which is positioned above in the vertical direction (the area surrounded by broken line AR2 in the drawing), the force which holds the wafer W—which is attempting to move in the direction in which the force due to angular velocity occurs—is due to the physical contact resulting from the protruding portion of the holding pin 20 and the wafer W. Consequently, when the holding pins 20 soften, holding by the protruding portion tends to loosen. In addition, when the wafer W which has sustained the force due to angular velocity bends, there is a risk that it may deform beyond the protrusion amount of the softened holding pins, and that the wafer W may similarly drop off.

In contrast, as shown in FIG. 7B, with the ion implantation apparatus of the present embodiment, the holding pin 20 which is positioned above in the vertical direction constitutes the second holding pin 20B which has a larger protrusion amount than the other holding pins. That is, when the wafer W turns together with the wafer holder 11 around the second rotational axis R, and when the wafer holder 11 is stopped at a position where the wafer W is inclined, an inertial force b' is exerted on the wafer W in the direction of rotation due to the diminution of angular velocity. In the present embodiment, the holding pin 20 to which this inertial force b' is imparted is the second holding pin which has the large protrusion amount. Consequently, the force which holds the wafer W during the above-described rotary motion is reinforced.

Here, the protrusion amount of the first holding pin 20A is 0.1 mm or more and less than 0.2 mm; and 0.1 mm or more and 0.15 mm or less is preferable. The protrusion amount of the second holding pin 20B is 0.2 mm or more and 0.4 mm or less; and 0.2 mm or more and 0.3 mm or less is preferable. When the holding pins are provided with protrusion amounts of such size, it is possible to combine reinforcement of the holding force exerted by the second holding pin 20B with inhibition of the occurrence of pin marks. When the protrusion amounts are smaller than these values, the holding force exerted on the wafer W becomes too low, and stability diminishes; when larger than these values, pin marks tend to occur, because the protrusion amount becomes too large.

Thus, if the holding pin which is positioned above in the vertical direction at the time when the wafer W is turned is the second holding pin 20B with the larger protrusion amount than the other holding pins, it is possible to conduct satisfactory holding and prevent droppage when the wafer W is raised to an inclined state.

Figure 8:
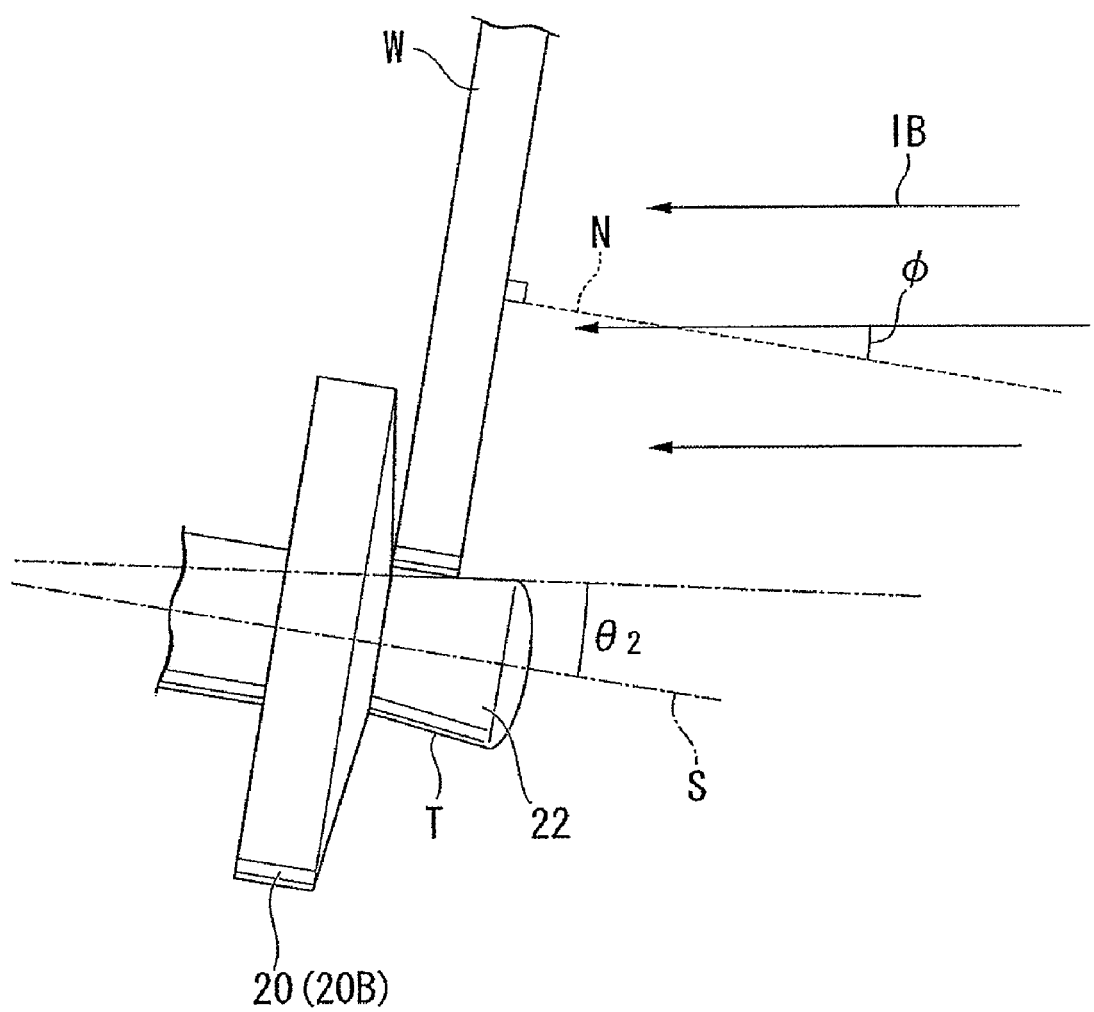
FIG. 8 is a side view which shows the circumstances of ion beam irradiation of a wafer.

FIG. 8 is an explanatory view which shows the circumstances of the irradiation of the wafer W with the ion beam IB which is shown in FIG. 6B.

The wafer W is held at an incline relative to the radiation direction of the ion beam IB with which irradiation is conducted. With respect to an angle of incidence $\phi$ of the ion beam IB relative to the wafer W, the degree of the angle is controlled by the emission angle of the ion beam IB from the emission port 6 shown in FIG. 1, and by the angle of depression of the center axis of the inclined wafer W. In the present embodiment, the ion beam IB is made to radiate in the horizontal direction, that is, parallel to the first rotational axis P, and the angle of incidence $\phi$ is controlled by the angle of depression of the center axis of the wafer W. That is, the angle of incidence $\phi$ indicates an angle that is constituted by the center axis of the wafer W and the optical axis of the ion beam that radiates from the emission port 6 in a direction parallel to the first rotational axis. The inclination of the wafer W is controlled by the turning angle of the wafer holder 11 around the second rotational axis R. In the present embodiment, the angle of incidence $\phi$ is 10°.

On the other hand, the side face T of the second holding pin 20B is inclined relative to the axis line S of the second holding pin 20B proportionate to the angle of inclination $\theta 2$. In the present embodiment, the angle of inclination $\theta 2$ is 10° as stated above.

That is, in the ion implantation apparatus of the present embodiment, the angle of inclination $\theta 2$ of the side face T is given the same angular degree relative to the angle of incidence $\phi$ of the ion beam IB. Consequently, a protruding portion due to the second holding pin 20B does not occur in the vicinity of the second holding pin 20B, enabling inhibition of the occurrence of pin marks.

With the ion implantation apparatus of the present embodiment, the angle of incidence $\phi$ is set at 5° or more and 20° or less. It was found that, in order to have the wafer satisfactorily held by the holding pins, it is sufficient to provide an angle of inclination of 5° or more. Consequently, when holding pins which enable satisfactory holding are used, and when the angle of incidence $\phi$ of the ion beam IB is smaller than 5°, the holding pins create a protruding portion which blocks the ion beam IB, and pin marks are found to have occurred on the wafer W after ion implantation. Moreover, it is undesirable when the inclination of the wafer holder 11 is larger than 20°, because it becomes difficult to conduct ion implantation into the interior of the wafer W.

That is, when the relation between the angle of incidence $\phi$ of the ion beam IB and the angle of inclination $\theta 2$ of the side face T of the second holding pin 20B satisfies the size relations of $5°\leq\theta2\leq\phi<20°$, pin marks do not occur in the vicinity of the second holding pin 20B, and satisfactory ion implantation can be conducted.

Thus, by selecting holding pins of optimal shape according to the positional arrangement of the holding pins 20, and by controlling the angle of incidence of the ion beam IB in conformity therewith, it is possible to combine prevention of wafer droppage during replacement operations and uniform ion implantation within the wafer.

According to the ion implantation apparatus 1 of the foregoing type of configuration, it is possible to combine prevention of wafer W droppage during high-temperature replacement operations and uniform ion implantation within the wafer, and to form a high-quality SOI substrate by conducting satisfactory ion implantation.

Moreover, with respect to the ion implantation apparatus 1 of the present embodiment, the protrusion amount d1 of the first holding pin 20A is 0.13 mm, and the protrusion amount of the second holding pin 20B is 0.25 mm. Given protrusion amounts of such size, it is possible to combine reinforcement of the holding force of the second holding pin 20B and inhibition of occurrence of pin marks.

Moreover, in the ion implantation apparatus 1 of the present embodiment, as the angle of incidence $\phi$ is set to 5° or more and 20° or less, ion implantation treatment can be satisfactorily conducted.

In the present embodiment, the ion implantation apparatus I has been described in terms of using a SIMOX method wherein an SOI substrate is formed by implantation of oxygen ions into a silicon wafer. However, as to the type of SIMOX method, any of the ordinarily known SIMOX methods—such as the High Dose SIMOX method, Low Dose SIMOX method, or MLD (Modified Low Dose) method—may be suitably applied.

In the present embodiment, the ion species which is implanted in order to form the SOI substrate is determined to be oxygen ions, but it is also possible to select other ion species according to the purpose.

In the present embodiment, the first holding pin 20A and second holding pin 20B were made such that the protrusion amount d is changed by changing the degree of the angle of inclination of the side face T, but methods for changing the protrusion amount d are not limited thereto. For example, with respect to the holder 22, it is also acceptable to cut the portion above the contact part T1 of the circumferential edge W1 of the wafer W and the side face T of the holder 22, and reduce the extent of occurrence of the protruding portion Pn. In addition, even if the angles of inclination of the side faces T of the first holding pin 20A and second holding pin 20B are identical, it is acceptable to create a difference in the protruding portions Pn by elevating the side face T of the second holding pin 20B higher than that of the holder 22 of the first holding pin 20A.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An ion implantation apparatus which conducts ion implantation with respect to wafers, comprising:
    a hub which is capable of rotating around a first rotational axis; and
    multiple wafer holders which are provided on the hub, and which hold wafers,
    wherein the wafer holders comprise a support body which is capable of rotating around a second rotational axis that crosses the first rotational axis, and at least three or more holding pins which are provided on the support body, which contact the outer periphery of the wafer, and which hold the wafer in a fixed position relative to the support body;
    the holding pins respectively contact the outer periphery of the wafer, and have an inclined side face which inclines so that it approaches a center axis of the wafer as it moves away from the wafer holder;
    the holding pins include a first holding pin in which the angle of inclination of the inclined side face relative to a line that is parallel to the center axis of the wafer is $\theta1$, and a second holding pin in which the angle of inclination of the inclined side face relative to a line that is parallel to the center axis of the wafer is $\theta2$;
    the angle of inclination $\theta2$ of the second holding pin is larger than the angle of inclination $\theta1$ of the first holding pin; and
    the protrusion amount of the second holding pin relative to the wafer is larger than the protrusion amount of the first holding pin relative to the wafer.

2. The ion implantation apparatus according to claim 1, wherein the holding pins are formed using formative material which includes thermohardening resin or photohardening resin.

3. The ion implantation apparatus according to claim 1, wherein the protrusion amount of the first holding pin relative to the wafer is 0.1 mm or more and less than 0.2 mm, and the protrusion amount of the second holding pin relative to the wafer is 0.2 mm or more and 0.4 mm or less.

4. An ion implantation method using the ion implantation apparatus according to claim 1, comprising:
    a wafer holding process wherein the wafer which is supplied from a wafer conveyor is held on the support body by having the holding pins contact the outer periphery of the wafer; and
    an ion beam irradiation process wherein the wafer is irradiated with an ion beam from an ion beam emission port,
    wherein, in the wafer holding process, the wafer holder is inclined by rotating the support body around the second rotational axis so that the distance between the wafer conveyor and the second holding pin on a line that is parallel with the first rotational axis is longer than the distance between the wafer conveyor and the first holding pin on a line that is parallel with the first rotational axis;
    in the ion beam irradiation process, the wafer holder is inclined by rotating the support body around the second rotational axis so that the distance between the ion beam emission port and the second holding pin on a line that is parallel with the first rotational axis is longer than the distance between the ion beam emission port and the first holding pin on a line that is parallel with the first rotational axis; and
    an angle of inclination $\theta2$ of the second holding pin is equal to or less than an angle of incidence $\phi$ of an ion beam on an ion beam irradiation surface of the wafer.

5. The ion implantation method according to claim 4, wherein the angle of incidence $\phi$ of the ion beam is 5° or more and 20° or less.

* * * * *